United States Patent [19]

Fossati et al.

[11] Patent Number: 4,646,304
[45] Date of Patent: Feb. 24, 1987

[54] SINGLE ERROR CORRECTION CIRCUIT FOR SYSTEM MEMORY

[75] Inventors: Paolo Fossati, Cinisello Balsamo; Paolo Melloni, Milan, both of Italy

[73] Assignee: Honeywell Information Systems Italia, Milan, Italy

[21] Appl. No.: 732,775

[22] Filed: May 10, 1985

[30] Foreign Application Priority Data

May 26, 1984 [EP]  European Pat. Off. .......... 84106012

[51] Int. Cl.⁴ ...................... G06F 11/00; G06F 11/10
[52] U.S. Cl. .......................................... 371/38; 371/13
[58] Field of Search ............................. 371/13, 15–16, 371/20–21, 30, 37–40, 72

[56] References Cited

U.S. PATENT DOCUMENTS

| 4,077,565 | 3/1978 | Nibby et al. | 235/153 |
| 4,175,692 | 11/1979 | Watanabe | 371/38 X |
| 4,249,253 | 2/1981 | Gentili et al. | 371/38 |
| 4,255,808 | 3/1981 | Schaber | 371/38 |
| 4,319,356 | 3/1982 | Kocol et al. | 371/38 |
| 4,319,357 | 3/1982 | Bossen | 371/38 |
| 4,359,771 | 11/1982 | Johnson et al. | 371/13 |
| 4,380,812 | 4/1983 | Ziegler, II et al. | 371/38 |
| 4,523,314 | 6/1985 | Burns et al. | 371/38 |
| 4,532,629 | 7/1985 | Furuya et al. | 371/38 |
| 4,561,095 | 12/1985 | Khan | 371/38 |

FOREIGN PATENT DOCUMENTS

A0037705  1/1981  European Pat. Off. .

Primary Examiner—Gary V. Harkcom
Attorney, Agent, or Firm—N. Prasinos; J. S. Solakian

[57] ABSTRACT

An improved single error correction circuit for a system memory storing in each of its addressable locations a data word and a corresponding error correcting code, which when read out from memory are fed to a syndrome generator which generates in output an error syndrome indication, comprising a set of registers arranged in banks, a first register in each bank for storing a prefixed portion of the data word read out from memory, the other registers in each bank for storing all the possible data configuration obtained from the prefixed portion of the data word stored in the first register of the same bank by inverting one data bit, so that a corrected read out data word is available in such registers in advance of syndrome indication which decoded, provides selection signal enabling one selected register per each bank to output, with minimum delay the latched portion of the data word.

4 Claims, 6 Drawing Figures

SINGLE ERROR CORRECTION CIRCUIT FOR SYSTEM MEMORY

BACKGROUND OF THE INVENTION

1. Field of the Invention

The present invention relates to a single error correction circuit for a system memory.

2. Description of Prior Art

Memory errors are tending to become more and more frequent as the total system memory is growing and the geometry of individual memory cells is shrinking, making them more susceptible to "soft" and "hard" errors.

To avoid a system crash or a loss of data integrity memory errors have to be recovered during system operation.

The identification and the correction of errors present on information readout from the memory is possible by means of redundancy codes among which the most commonly used, the so-called SEC-DED (Single Error Correction-Double Error Detection), provide detection and correction of single bit errors in the readout data and detection, but not correction, of double errors on the readout data.

The use of redundancy codes requres that, in storing a binary coded information, the error correcting code associated with the information must be generated and then stored in the memory along with the information. Likewise it is necessary, before using information readout from the memory, to process it by generating the related code and comparing it with the one already stored and readout with the information. From this comparison an error condition may result which, through a correction network, leads, if necessary, to the correction of the read out information.

These operations of correction code generation, correction code regeneration on readout, comparison and correction, if necessary, are performed by means of logical circuits which have a certain, non negligible intervention time.

In the case of error code generation during a write operation in memory, the generation time and the time required for memory addressing may overlap, consequently no delay is added.

However, in the case of error code regeneration and comparison during a read operation the necessary functions can be performed only after the reading has been completed, whereupon the validation process imposes a certain delay time on memory readout operations.

This delay may greatly hamper memory performance as it is a non negligible percentage of the readout time.

Referring to error detection/correction systems used in the prior art and described in a lot of patents, as for instance U.S. Pat. Nos. 4,319,356 and 4,380,812, the circuits of such systems which intervene during a memory read operation substantially comprise a syndrome bit generator receiving in input the information and the related error correcting code readout from memory, a syndrome decoder receiving in input the syndrome bits and a correction circuit receiving in input the information readout from the memory and the signals on the outputs of the syndrome decoder, each of said signals being associated to a prefixed bit of the readout information to indicate the correctness or incorrectness of such bit.

The validation delay time $\Delta T_V$ introduced by the above circuits may be expressed as follows:

$$\Delta T_V = \Delta T_{SG} + \Delta T_{SD} + \Delta T_{CC}$$

where:

$\Delta T_{SG}$ is the propagation delay time of the syndrome generator, $\Delta T_{SD}$ is the propagation delay time of the syndrome decoder $\Delta T_{CC}$ is the propagation delay time of the correction circuit.

It is to be noted that in the expression of $\Delta T_V$ the terms $\Delta T_{SG}$ and $\Delta T_{CC}$ generally predominate over $\Delta T_{SD}$ because both the syndrome generator and the correction circuit are implemented by means of EX-OR logical gates which have a propagation delay much higher than the one of other logical gates.

SUMMARY OF THE INVENTION

The main purpose of the present invention is to reduce the validation delay time $\Delta T_V$ by reducing to a minimum $\Delta T_{CC}$.

OBJECTS OF THE INVENTION

According to an aspect of the invention this is achieved by using an error correction circuit which comprises a plurality of registers into which, at the end of the memory read cycle, the readout information and all the possible configurations obtained from such information by inverting a data bit are stored.

Afterwards the syndrome decoder suitably selects the appropriate register to render available in output the exact data word. In such a way $\Delta T_{CC}$ is reduced to the time necessary to the selected register to put in output the stored information and is negligible compared with the propagation delay time of a network implemented with EX-OR logical gates.

According to another aspect of the invention to reduce the number of register cells and therefore allow an easier integration of the correction circuit of the present invention within a VLSI memory controller chip, the registers are shared in groups, each register group being devoted to store a portion of the readout data word and all the possible configurations obtained from such portion by inverting one bit. For instance, if the parallelism of the data words is two bytes and the registers of a group are devoted to store a prefixed digit of the readout data word and all the possible configurations obtained from such digit by inverting one bit, 20 registers, each having four cells, are sufficient to implement the single error correction of the present invention.

BRIEF DESCRIPTION OF THE DRAWINGS

These and other features will become apparent from the following description of a preferred embodiment of the invention and from the accompanying drawings where.

DESCRIPTION OF THE PREFERRED EMBODIMENTS OF THE INVENTION

Figure 1:
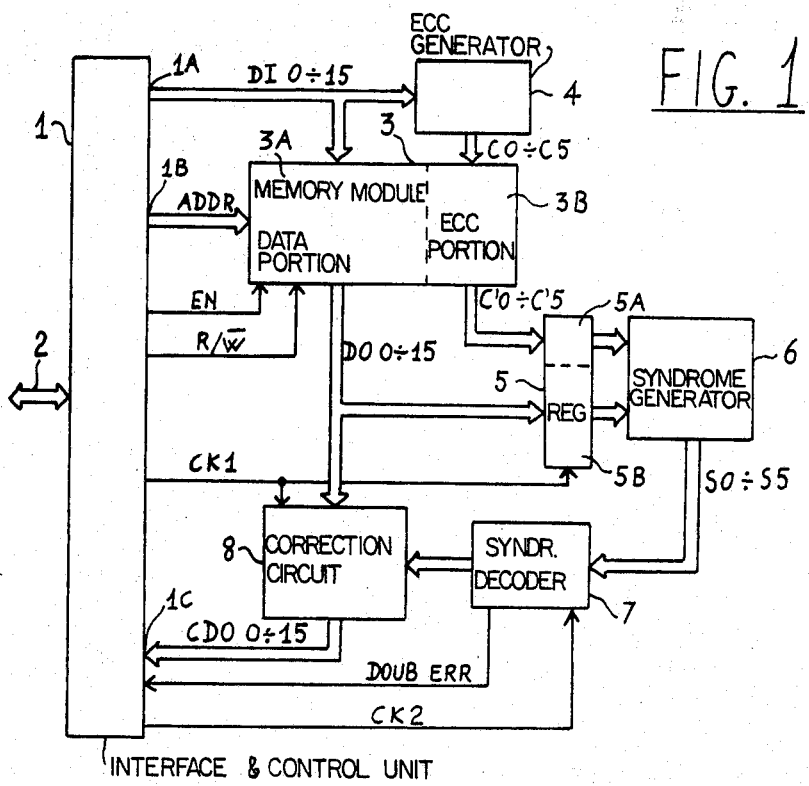
FIG. 1 schematically shows a system memory provided with the single error correction circuit of the present invention.

Memory of FIG. 1 is part of a data processing system and comprises an interface and control unit 1 which allows a correct information exchange via system bus 2 with one of the several processing units constituting the data processing system.

The description of interface and control unit 1 is omitted as both well known in the prior art and unessential for the invention understanding.

Embodiments of unit 1 may be found for instance in U.S. Pat. No. 4,249,253 or in EPO Application No. 83110751.1 published on May 16, 1984 with No. 108346.

System memory of FIG. 1 further includes a memory module 3 ideally shared in a data memory portion 3A and in an ECC (Error Correcting Code) memory portion 3B, an ECC generator 4, a latch register (LREG) 5, a syndrome generator 6, a syndrome decoder 7 and a correction circuit 8 carried out according to the present invention by a plurality of registers.

Memory module 3 is constituted by a plurality of memory chips (for instance of the type marketed by MOSTEK with code MK 4564) suitably connected in parallel to obtain the desired parallelism.

In the case of the described embodiment the data of memory portion 3A has a length of 16 bits and the codes of memory portion 3B a length of 6 bits in order to allow single bit correction and double bit error detection.

The parallelism of memory module 3 is therefore 22 bits.

Data inputs of memory portion 3A are connected to output set 1A of unit 1 on which, during a memory writing operation, input data bits DI 0 ÷15 to be stored are present. Data bits DI 0 ÷15 are also applied to inputs of ECC generator 4 whose outputs, on which parity check bits C0÷C5 are present, are coupled to data inputs of memory portion 3B.

In such a way, when a writing operation is commanded, a redundancy code constituted by bits C0÷C5 is associated to the data to be written into memory portion 3A.

A detailed description of ECC generator 4, built up with EXCLUSIVE OR (XOR) gates, is omitted because it is well known in the prior art. An embodiment of such generator may be found for instance in the already mentioned U.S. Pat. No. 4,249,253.

The function of generator 4 is to generate six parity bits C0÷C5 each indicating the presence of a certain combination of the 16 input data bits DI 0 ÷15 at level 1.

Figures 2, 5:
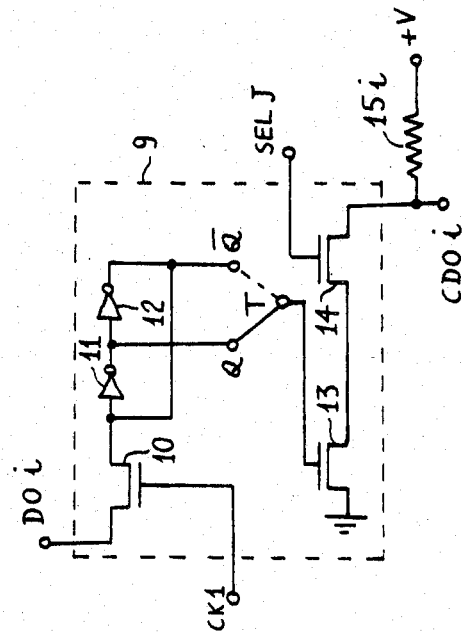
FIG. 2 is a logic table showing the relationship between data bit signals and parity bit signals generated by the error detection/correction circuits of system memory of FIG. 1.
FIG. 5 shows the structure of the cells of registers of FIG. 4.

FIG. 2 shows in table form the combination of input data bits DI 0÷15 (marked with a cross) which are considered for generation of each of the six parity bits C0÷C5.

Coming back to FIG. 1, the addressing inputs of memory module 3 are coupled to output set 1B of unit 1 on which signals ADDR, specifying the location involved in the memory operation, are present at the beginning of a memory cycle.

Memory module 3 is provided with two control inputs on which signals R/$\overline{W}$ and EN, coming from unit 1, are applied.

Signal R/$\overline{W}$, when at logical level 1(0), indicates a memory reading (writing) operation.

Signal EN, when at logical level 1, indicates the beginning of a memory cycle.

Outputs of data and ECC memory portions (on which data output bits DO 0÷15 and parity check bits C'0÷C'5 are respectively present) are connected to inputs of portion 5A, 5B of latching register 5 (LREG) which receives at its control input a signal CK1 coming from an output of unit 1.

When signal CK1 rises to logical level 1 during a memory reading operation, data bits DO 0÷15 and related parity check bits C'0÷C'5 are loaded into register 5 and are available on its outputs.

Output of portions 5A, 5B of register 5 are connected to two input sets of syndrome generator 6.

A detailed description of syndrome generator 6, which is built up with EXCLUSIVE (XOR) gates too, is omitted as well known in the prior art. An embodiment of it may be found for instance in the above mentioned U.S. Pat. No. 4,249,253.

The function of syndrome generator 6 is to generate a parity code consisting of six bits based on the actual value of the data bits DO 0÷15 read out from memory. The data bits taken into account in the generation of such parity code are the same used to generate the parity bits C0÷C5 already stored in the memory and which are read out from memory, together with data bits DO 0÷15, as parity bits C'0÷C'5.

The new parity code bits are compared with the parity bits C'0÷C'5. If all bits match, a syndrome comprised of six bits Si (i=0 ... 5) "all zeroes" is generated which indicates that no error affects the read out data as well as the read out parity bit.

It there is a mismatch, a syndrome code is generated where bit mismatching is pointed out by bits at logical level 1.

This logical operation of generator 6 is substantially shown in the same table of FIG. 2 where each syndrome bit Si is the result of the parity calculation on bits DO 0÷15 and C'0÷C'5 marked with a cross. Syndrome bits S0÷S5 are applied to inputs of syndrome decoder 7. Syndrome decoder 7 receives at a control input a signal CK2 coming from an output of unit 1.

When signal CK2 rises to logical level 1, syndrome decoder 7 renders available on its outputs a plurality of control signals indicating in their whole if the data read out from memory portion 3A is affected with a bit error, in which case they are also specifying the error bit position. Besides decoder 7 renders available on an additional output signal DOUB ERR which is sent to unit 1 and indicates, when at logical level 1, that the information read out from memory 3 is affected with a double bit error.

Data outputs of memory portion 3A are also connected to inputs of correction circuit 8 including a plurality of registers which receive at their control inputs signal CK1.

When signal CK1 rises to logical level 1 during a memory reading operation, one of the registers of circuit 8 latches the information DO 0÷15 present on outputs of memory portion 3A, whilst the remaining registers latch all the possible configurations obtained from such information by inverting one data bit.

Subsequently the control signals in output from decoder 7 provide to select the suitable register of circuit 8 which is latching the correct data. Such register is therefore enabled to put on outputs CDO 0÷15 of circuit 8 the data it is latching.

Figure 3:
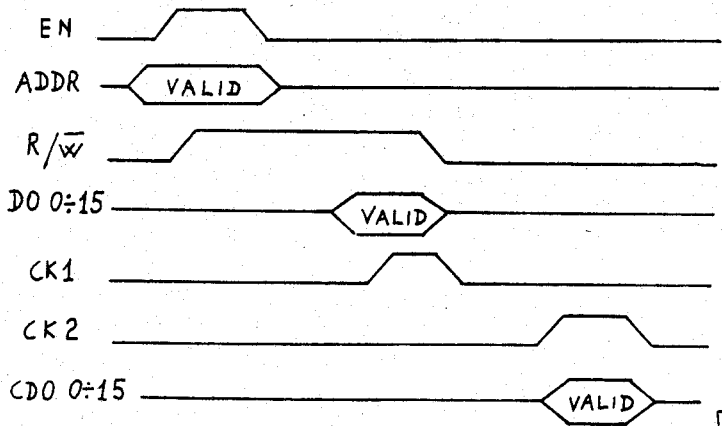
FIG. 3 shows in qualitative timing diagram the read cycle of the memory of FIG. 1.

Outputs CDO 0÷15 of circuit 8 are connected to input set 1C of unit 1. FIG. 3 shows as a qualitative example the timing diagram of signals EN, ADDR, R/W̄, DO 0÷15, CK1, CK2, CDO 0÷15 for a memory reading operation. Referring again to correction circuit 8, it is clear that, as the data word is constituted by 16 data bits 17 registers, each of 16 bit, can be used to implement the invention in its simplest form.

However in order to reduce the number of register cells so as to facilitate the integration process of correction circuit 8 in a memory controller chip, the registers of the correction circuit may be organized in a better way.

Since the purpose of correction circuit 8 is to correct a single error, the information to be possibly corrected may be partitioned in portions and, if error is present in one portion, no error will be present in the other portions.

Hence, the above concept of having registers for storing the information as it is read out from memory and for storing the same information with one of the composing bits inverted may be applied to the individual portions, the total corrected information resulting from the combination of the individual portions, one only of which is possibly corrected. For a 16 bit information a preferred partitioning is in 4 digits (4 bit portions) which leads to a correction circuit organized as shown in FIG. 4 and providing further advantages which will be pointed out in the following.

Figure 4:
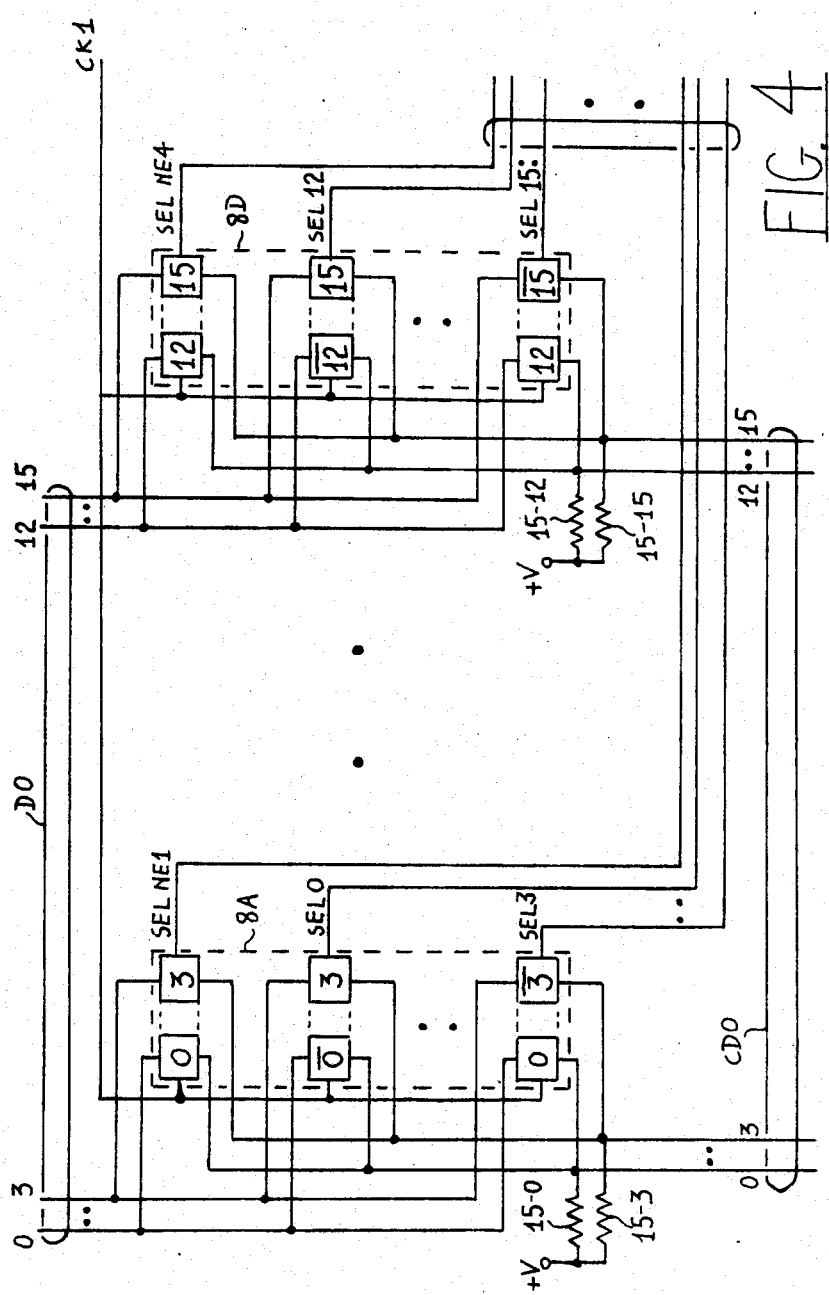
FIG. 4 is a schematic diagram showing the preferred organization of the registers constituting the correction circuit of system memory of FIG. 1.

FIG. 4 shows that correction circuit 8 comprises 4 banks 8A, . . . , 8D of 5 registers, each register being constituted by 4 cells having the structure of FIG. 5 and storing a digit of information.

FIG. 5 shows that register cell 9 comprises a FET (field effect transistor) switch 10 which, when switched on by signal CK1 at logical level 1, statically transfers the logical level of signal D0i at its data input to the loop constituted by the two NOT gates 11, 12.

Two outputs Q and $\bar{Q}$ are derived from such loop.

The cell is completed by two additional FET switches 13, 14 series connected between ground and a voltage source +V through a pull-up resistor 15$i$.

FET switch 13 is controlled by the signal on output Q or $\bar{Q}$ according to the preset (during manufacturing) of electrical connection T whilst FET switch 14, on whose drain is present data output signal CDOi, is controlled by signal SELj coming from decoder 7.

It is clear that, with signal SELj at logical level 1, CDOi signal will be at the same or inverted logical level of signal DOi depending on whether gate of switch 13 is connected to loop output Q or $\bar{Q}$ by connection T. This is equivalent to store a bit in direct or inverted form. Coming back to FIG. 4, cell i (i=0, . . . , 15) of each register receives at its data input the corresponding read out data bit D0i, such bit being latched in cell i in direct form or in inverted form according to the position of connection T (FIG. 5) of cell i.

In FIG. 4, if the cell i latches the read out bit of weight i in inverted form, the negation symbol is used for cell i to evidence this behaviour.

The output of cell i of each register is coupled to the corresponding output CDOi and is in high impedance state when signal SELj (j=NE1, . . . , NE4, 0, . . . , 15) coming from decoder 7 is at logical level 0. Each output CDO 0÷15 is connected to a voltage source +V through a pull-up resistor 15-0, . . . , 15-15.

It is clear from FIG. 4 that the first register of bank 8A ( . . . , 8D) is devoted to latch, when CK1 rises to logical level 1, the read out data bits of weight 0÷3 ( . . . , 2÷15), whilst the other registers of the same bank are devoted to latch all the possible configurations of the same data bits which are obtained by inverting one bit.

Subsequently only one register for bank is enabled to put in output the information it is latching according to the logical level of control signals provided by syndrome decoder 7.

Figure 6:
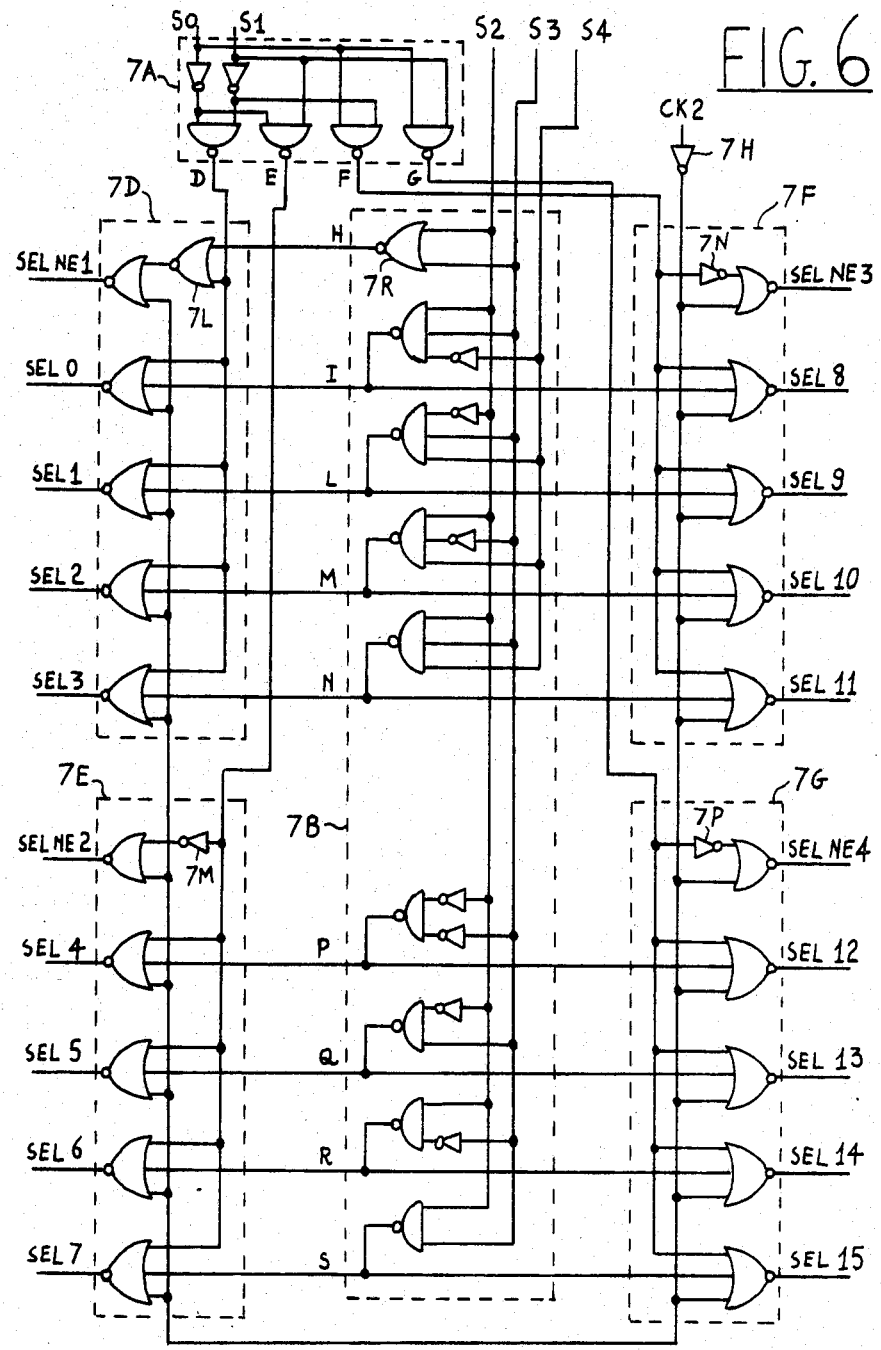
FIG. 6 is a schematic diagram of the logic circuits forming the syndrome decoder of system memory of FIG. 1.

FIG. 6 shows the logical circuits of syndrome decoder 7 devoted to generate control signal SELj (j=NE1, . . . , 0, . . . , 15) of FIG. 4. A description of the logic circuits of syndrome decoder 7 devoted to generate signal DOUB ERR is omitted because such circuits are well known in the art and may be found for instance in the mentioned U.S. Pat. No. 4,249,253.

It is to be noted that, thanks to the arrangement of the correction registers in banks, each latching a portion of the data information, the selection of the correct information or appropriate register is reconducted to the selection of the correct information or appropriate register within each bank, which selection may be performed in parallel on each bank.

Thus the syndrome decoder may be divided in a number of syndrome decoders equal to the number of register banks, but each decoder having to select a register in a number of registers which is lesser than the number of the information bits.

This leads to embodiments where the overall number of gates involved in the embodiment of the syndrome decoder may be greater than in the conventional case, but where the number of gates involved in the embodiment of each individual syndrome decoder (for each bank) is lesser than in the conventional case.

This results in a smaller chip surface required to implement the individual syndrome decoders in an integrated circuit, a reduced number of leads, shorter connections, smaller stray capacitances and consequently a reduction of the propagation delay $\Delta T_{SD}$ in the syndrome decoder 7. This advantage may be further enhanced by a suitable selection of the data bits DI/DO 0÷15 involved in the parity calculation to obtain C0÷C5 and S0÷S5.

It is well known that a certain freedom exists in such selection. Thus, as shown in FIG. 2, the symptoms S0, S1 may be generated, so as to detect in which of the information digit a possible error exists, whilst symptoms S2, S3, S4 may be generated so as to detect, within the digit the bit affected by error.

In such a way S0 S1 and S2 S3 S4 can be processed in parallel by syndrome decoder 7 and therefore the propagation delay time of such decoder can be further reduced.

Besides, as syndrome portion S2 S3 S4 may assume the same configuration for several data bits, the number of logic gates consituting decoder 7 can be reduced.

A detailed description of FIG. 6 relating to the interconnection of the several logic gates, is avoided because unessential.

It is only noted that syndrome decoder may be divided in the following major blocks.

a digit identification block 7A
a "bit-within-digit" identification block 7B four control gate sets 7D, 7E, 7F, 7G.

The control gate sets are clocked by signal CK2, through NOT 7H, and only one control gate per set at a time is enabled depending on signals received in input, to deliver a corresponding output signal SELj at logical level 1.

Control gate set 7D further includes NOR gate 7L, and control gate sets 7E, 7F, 7G further include NOT 7M, 7N, 7P respectively. The digit identification block 7A is composed of two NOT gates and four 2-input NAND gates.

It receives in input symptoms S0 S1 and delivers in output four signals D, E, F, G only one of which, at a time, is a logical level 0. Which of the signals D, E, F, G is at logical level 0 is determined by level of symptoms S0, S1.

Level of signals D, E, F, G identifies which of the information digit is affected by error.

For instance if G=0, D, E, F=1 there is an error to be corrected in one of the last four bits 12, ..., 15 of the information.

Consequently a gate in each set 7D, 7E, 7F is enabled (through gates 7L, 7M, 7N respectively) to deliver selection signal SEL NE1, SEL NE2, SEL NE3 respectively, whilst the other gates in sets 7D, 7E, 7F are inhibited whatever is the level of symptoms S2, S3, S4.

In set 7G the gate which could generate signal SEL NE4 is inhibited (through NOT 7P), whilst the other gate are enabled.

Which signal among SEL 12 to SEL 15 is generated depends on the level of symptoms S2, S3, S4.

Likewise, if D=0 E, F, F=1 the information is unaffected by error, or if there is an error, it is in the first digit. Thus that gate in each set 7E, 7F, 7G which delivers signal SEL NE2, SEL NE3, SEL N4 respectively is enabled.

In gate set 7D, no one of the control gates is inhibited by signal D=0 and selection depends on level of symptoms S2, S3, S4.

The "bit-within-digit" identification block 7B is composed of NAND gates, NOT gates, and one NOR gate 7R.

It receives in input symptoms S2, S3, S4 and delivers in output two sets of signals, I, L, M, N and P, Q, R, S and a further signal H. It can be easily seen that, within each set of signals, one signal at a time can be at logic level 0 at the exclusion of the others.

Signals I, L, M, N, when at 0, enable a corresponding gate on the sets 7D and 7F.

Signals P, Q, R, S when at 0, enable a corresponding gate in the sets 7E, 7G.

Signal H, in output from NOR 7R, is fed to an input of NOR gate 7L and controls generation of signals SEL NE1, which must raise to level 1 when not only condition S0, S1=0 is met, but also condition S2, S3=0. It is clear that several changes can be made in described syndrome decoder and more generally in the error correction circuit, without departing from the scope of the invention.

In particular any organization of the correction network registers can be chosen.

In other words, if the data word length is N bit, the register organization may range from N+1 registers, each having N cells, to 2N registers, each having 1 cell, and include any intermediate organization where any selected portion of the data information is stored in one independent register and for any selected portion further registers are provided to store any possible information obtained from the selected portion by inversion of one information bit.

Obviously preferred partitioning are those which produces equal sized portions where the number of portions equals or approximates at best the number of bits in each portions so that the symptoms of the syndrome may be related in substantially equal number to the identification of the information portion where error is present, and to the identification of the error bit within the portion, thus minimizing complexity and propagation delay of the syndrome decoder.

What is claimed is:

1. An improved single error correction circuit for a memory system including:
   interface and control means (1) for allowing a correct information exchange with other system units and for controlling said system memory,
   a memory module (3) having a first memory portion (3A) for storing a plurality of data words each data word being constituted by N data bits and a second memory portion (3B) for storing a plurality of error correcting codes, each one of said correcting codes being associated with a corresponding one of said data words in said first memory portion,
   error correcting code generation means (4) for generating a correcting code associated with each data word to be stored in said second memory portion,
   error syndrome generation means (6) receiving a data word and the related correcting codes respectively read out from said first and second memory portions and for generating an error syndrome indication based thereon wherein the improvement consists in that said correction circuit comprises:
   a plurality of registers (8) arranged in a number J of banks ranging from 1 to N, the registers in each bank having preestablished equal bit capacity K comprised between N and 1 and the sum of the bit capacity of J registers, one for each bank, being equal to N, each bank having a number of registers equal to its capacity plus one, each bank receiving in input a different portion of a data word read out from said first memory portion and storing in one of its registers said data word portion as read out from said first memory portion and in the remaining registers all the possible bit configurations obtained from said data word portion by inverting one data bit, and
   syndrome decoding means (7) receiving an error syndrome indication and generating a plurality of control signals, one for each of said plurality of registers, said control signals selecting and enabling at the same time one register in each bank to output the data word portion or bit configuration stored therein.

2. Single error correction circuit of claim 1 wherein said registers comprise storage cells (9) where information bit is stored through injection in a node of a loop comprising two NOTS (11,12) and maintained through recirculation in said loop, each of said storage cells having an output controlled to deliver to output the information bit injected in said loop or the inverted bit by a control gate (13) depending on the connection of a control electrode either to said mode of injection or to a point of said loop, one NOT downstream from said node of injection.

3. Single error correction circuit of claim 1 characterized by that said number J of register banks is equal to N/V, where V is any one of the integral submultiples of N, all registers having bit capacity equal to N/V, the information read out from said first memory portion being divided in V portions all having the same bit length.

4. Single error correction circuit of claim 3 characterized by that said syndrome decoding means comprise:
first circuital means (7A) responsive to a first portion of said syndrome indication to identify which of said V portions of the read out information is affected with error
second circuital means (7B) responsive to a second portion of said syndrome indication to identify within a portion of the read out information the bit position affected with error
a number N/V of control gate groups (7D÷7G) each coupled to one of said register banks and controlled by said first and second circuital means,
each of said control gate groups providing in output a signal (SEL NE1÷SEL NE4) indicative, when active, of no error on the related portion of said read out information and a number N/V of additional signals (SEL0÷SEL15) specifying the error bit position within the related portion of said read out information.

* * * * *